(12) United States Patent  
Katagiri et al.

(10) Patent No.: US 6,723,144 B2
(45) Date of Patent: Apr. 20, 2004

(54) SEMICONDUCTOR DEVICE FABRICATING METHOD

(75) Inventors: Souichi Katagiri, Kodaira (JP); Kan Yasui, Kokubunji (JP); Ryousei Kawai, Kodaira (JP); Sadayuki Nishimura, Yokohama (JP); Masahiko Sato, Kokubunji (JP); Yoshio Kawamura, Kokubunji (JP); Shigeo Moriyama, Tama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/308,088

(22) Filed: Dec. 3, 2002

(65) Prior Publication Data

US 2003/0084998 A1 May 8, 2003

Related U.S. Application Data

(62) Division of application No. 09/359,760, filed on Jul. 22, 1999, now Pat. No. 6,524,961.

(30) Foreign Application Priority Data

Jul. 30, 1998 (JP) ............................................. 10-215119

(51) Int. Cl.⁷ ............................... B24D 3/02; C09C 1/68
(52) U.S. Cl. ......................... 51/308; 438/691; 438/693
(58) Field of Search ................................ 438/691–692, 438/693; 451/41, 60

(56) References Cited

U.S. PATENT DOCUMENTS

| 3,979,239 | A |   | 9/1976  | Walsh ............................. 156/4 |
| 4,944,836 | A |   | 7/1990  | Beyer et al. ................. 156/645 |
| 5,264,010 | A | * | 11/1993 | Brancaleoni et al. ......... 51/308 |
| 5,399,234 | A |   | 3/1995  | Yu et al. ....................... 156/345 |
| 5,441,598 | A |   | 8/1995  | Yu et al. .................. 156/645.1 |
| 5,688,364 | A |   | 11/1997 | Sato ............................. 216/88 |
| 5,876,470 | A |   | 3/1999  | Abrahamson ................. 51/309 |
| 5,916,819 | A |   | 6/1999  | Skrovan et al. .............. 438/692 |
| 5,958,794 | A |   | 9/1999  | Bruxvoort et al. ........... 438/692 |
| 5,972,792 | A |   | 10/1999 | Hudson ...................... 438/691 |
| 6,077,581 | A | * | 6/2000  | Kuramochi et al. ........ 428/64.1 |
| 6,524,961 | B1| * | 2/2003  | Katagiri et al. .............. 438/691 |

FOREIGN PATENT DOCUMENTS

| EP | 0874390 A | 10/1998 |
| JP | Hei 5-30052 | 5/1993 |
| JP | Hei 8-216023 | 8/1996 |
| WO | WO 97/10613 | 3/1997 |

* cited by examiner

*Primary Examiner*—Nadine G. Norton
*Assistant Examiner*—Duy-Vu Deo
(74) *Attorney, Agent, or Firm*—Antonelli, Terry, Stout & Kraus, LLP

(57) ABSTRACT

A film formed on a surface of a wafer on which an integrated circuit is to be constructed can be planarized by using a fixed abrasive tool regardless of the width of elements of a pattern underlying the film. The fixed abrasive tool is liable to form scratches in the surface of the film. A planarizing process of the present invention employs a fixed abrasive tool containing substances harder than the film to be planarized in a content of 10 ppm or below and having a mean pore diameter of 0.2 μm or below.

16 Claims, 9 Drawing Sheets

IMPURITIES IN ABRASIVE (ppm)

| KIND OF ABRASIVE | Fe | Ni | Mg | K | La |
|---|---|---|---|---|---|
| USUAL ABRASIVE | 120 | 6 | 97 | 1.2 | 1300 |
| PURIFIED ABRASIVE | <5 | 0.3 | <5 | <0.3 | 9 |

BACKGROUND

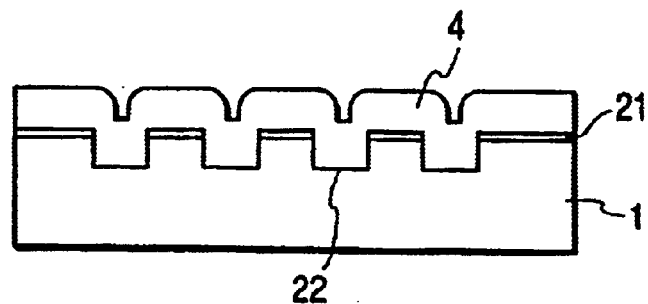
FIG. 9A
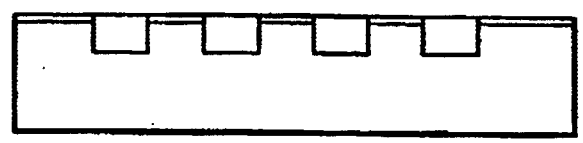
FIG. 9B
FIG. 10
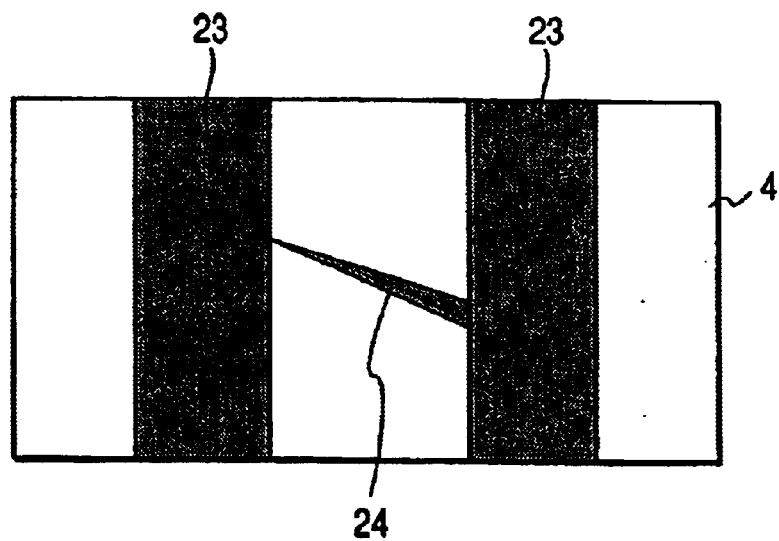

SEMICONDUCTOR DEVICE FABRICATING METHOD

This application is a Divisional application of application Ser. No. 09/359,760 now U.S. Pat. No. 6,524,961 filed Jul. 22, 1999, the contents of which are incorporated herein by reference in their entirety.

BACKGROUND OF THE INVENTION

The present invention relates to a polishing techniques for the planarization of a surface of a wafer and, more specifically, to a semiconductor device fabricating method which planarizes a thin film formed on a semiconductor wafer by polishing.

The number of components per semiconductor IC (integrated circuit) device has progressively increased in recent years and the component elements of semiconductor IC devices have been miniaturized accordingly. When forming those elements of a semiconductor IC device, films need to be patterned by lithography techniques. Light of a short wavelength and an optical element having a large numerical aperture must be used to form a minute pattern, which, however, involves reduction in the focal depth of the optical element. A semiconductor device fabricating method comprises many pattern forming processes. A metallization process will be described with reference to FIGS. 2A to 2F by way of example.

FIG. 2A is a sectional view of a semiconductor wafer 1 of silicon provided with a first interconnection layer 3 of aluminum thereon. A insulating film 2 is formed on a surface of the wafer 1 so as to cover transistors formed on the wafer 1. The first interconnection layer 3 is formed on the first insulating film 2. Parts 3' of the first interconnection layer 3 corresponding to holes formed in the insulating film 2 are recessed. An interlayer dielectric film 4, i.e., a silicon dioxide film inmost cases, and a second wiring line 5 of aluminum are formed on the first interconnection layer 3. A photoresist is applied to the second interconnection layer 5 to form a photoresist film 6 to be used for patterning the second interconnection layer 5 as shown in FIG. 2B.

Subsequently, as shown in FIG. 2C, the photoresist film 6 is exposed to light by a stepper 7 provided with a photomask and a demagnification projection lens to form an image of a circuit pattern formed on the photomask. If the stepper 7 has a small focal depth, the image of the circuit pattern cannot be focused properly on both recessed parts and projecting parts 8 of the photoresist film 6 and the image cannot be formed in a satisfactory resolution. Generally, the surface of the wafer 1 provided with the transistors is irregular, the stepper 7 must have a great focal depth.

The surface of the interlayer dielectric film 4 is subjected to a planarizing process to solve the foregoing problems. As shown in FIG. 2D, the interlayer dielectric film 4 is formed on the first interconnection layer 3 formed as shown in FIG. 2A. Portions of the interlayer dielectric film 4 projecting from a level 9 below the bottoms of the recessed parts of the interlayer dielectric film 4 are removed by the planarizing process using a chemical mechanical polishing method (hereinafter referred to as "CMP method") to planarize the surface of the interlayer dielectric film 4 as shown in FIG. 2E. Then, the second interconnection layer 5 of aluminum and the photoresist film 6 are formed to be exposed to light by the stepper 7. Since the surface of the photoresist film 6 thus formed is flat, the image of the circuit pattern can be formed in a satisfactory resolution even if the focal depth of the stepper 7 is small.

The CMP method is disclosed in U.S. Pat. No. 4,944,836 and Japanese Examined Patent Publication No. Hei 5-30052. FIG. 3 is a typical view of a CMP device illustrating the conception of the CMP method. As shown in FIG. 3, a circular polishing pad 11 is stuck on a turntable 12. The turntable 12 is rotated, for example, in a counterclockwise direction. The polishing pad 11 is, for example, a thin sheet of foam urethane resin formed by slicing a foam urethane resin block. Polishing pads respectively having different qualities and different degrees of minuteness in surface structure are used selectively according to the type of workpieces and desired surface roughness in which the surfaces of workpieces are to be finished. The wafer 1 is fixed to an elastic backing pad 13 fixed to a wafer holder 14. The wafer holder 14 is rotated in the same direction as the turntable 12, the wafer 1 is pressed against the surface of the polishing pad 11, and a polishing slurry 15 containing abrasive powder is supplied onto the polishing pad 11 to planarize the surface of the wafer 1 by polishing.

When polishing an insulating film of silicon dioxide or the like, high-purity silica (fumed silica) powder is used for polishing. The grain size of the silica powder is in the range of about 30 to about 150 nm. The polishing slurry 15 is prepared by suspending silica particles in an alkaline solution, such as a potassium hydroxide solution or an ammonia solution. The polishing slurry 15 is able to finish the surface of the wafer 1 in a flat, smooth surface not damaged significantly.

Another planarizing technique uses a fixed abrasive tool instead of the polishing slurry. A polishing device employed in executing the planarizing technique using the fixed abrasive tool has the same construction as the polishing device employed in the CMP technique, except that the former uses a fixed abrasive tool instead of the polishing pad. The fixed abrasive tool is attached to a platen, and deionized water is supplied instead of the abrasive slurry onto the fixed abrasive tool. This planarizing technique employing the fixed abrasive tool is disclosed in PCT International Publication No. WO 97/10613 and Japanese Patent Laid-open No. Hei 8-216023.

Pattern size dependence is a generally used quantitative index of macroscopic planarizing ability. When a wafer provided with a large pattern and a small pattern is subjected to polishing, the small pattern is polished at a polishing rate higher than that at which the large pattern is polished. When a large pattern and a small pattern are polished by a polishing process having a low planarizing ability, the difference in abraded amount between the large pattern and the small pattern is large. More concretely, pattern size dependence can be determined by polishing a pattern having some isolated lines having a height of about 0.8 $\mu$m and widths in the range of about 0.1 $\mu$m to about 5 mm, and spaces between the lines formed on a test wafer as shown in FIG. 8, and measuring the differences between the amounts of abraded portions of the isolated lines. When narrows lines of widths less than 1 mm and wide lines of widths not smaller than 3 mm are polished by using a standard polishing pad and a standard polishing slurry, the height of the wide lines is 0.38 $\mu$m or above when the narrow lines are abraded completely, and the wide lines cannot completely be abraded even if the polishing process is continued further.

As mentioned above, it is difficult to planarize completely a layer formed over a pattern and having steps corresponding to the pattern by the conventional CMP process. However, a memory mat of an actual 64 Mbit DRAM (dynamic random-access memory) has 8 to 10 mm sq. pattern elements of about 0.8 $\mu$m in height.

The foregoing planarizing process employing the fixed abrasive tool has an excellent ability to planarize pattern elements including large ones. The planarizing process employing the fixed abrasive tool is characterized by its very high planarizing ability. For example, as obvious from FIG. 8, whereas the CMP process planarizes a 3 mm wide pattern element to a height of 0.38 μm (380 nm), the planarizing process using the fixed abrasive tool is able to planarize the same pattern element to a height of 18 nm, which is extraordinarily small as compared with 380 nm.

The planarizing process employing the fixed abrasive tool is able to planarize pattern elements of large sizes of several millimeters or above which cannot satisfactorily be planarized by the CMP process because the abrasive grains of the fixed abrasive tool are fixed and the fixed abrasive tool has a high elastic modulus. Furthermore, since the fixed abrasive tool is scarcely subject to deformation, only projections on the surface of a workpiece can selectively be removed. Unlike the CMP process in which the polishing pad deforms conforming to the irregularities in the surface of the workpiece, the polishing process employing the fixed abrasive tool does not cut the bottoms of recessed parts in the surface of the workpiece. Therefore, when polishing the workpiece by the polishing process employing the fixed abrasive tool, it is unnecessary to take into account the amount of abrasion of recessed parts when estimating the amount of abrasion necessary for planarization, and hence the film to be planarized may be formed in a relatively small thickness. Since the fixed abrasive tool has abrasive grains, any polishing slurry is not necessary, the polishing apparatus for carrying out the polishing process employing the fixed abrasive tool needs very small maintenance costs.

SUMMARY OF THE INVENTION

Although the polishing process employing a fixed abrasive tool has an excellent planarizing ability, it liable to form scratches in the polished surface. The inventors of the present invention found that scratches can be classified into those of a macro scratch group and those of a micro scratch group. Macro scratches of the macro scratch group penetrate the interlayer dielectric film and have length in the range of 5 μm to several millimeters. Micro scratches of the micro scratch group do not penetrate the interlayer dielectric film, and have depth of 100 nm or below and length of 10 μm or below.

If scratches are formed in the interlayer dielectric film, metal films formed in the scratches cannot be removed by planarization to be executed in a Damascene metallization process and remains in the surface of the interlayer dielectric film as shown in FIG. 10. It is possible that metal films thus formed in micro scratches short-circuit adjacent wiring lines formed in the interlayer dielectric film. It is possible that metal films formed in macro scratches are connected to wiring lines underlying the interlayer dielectric film and short-circuit the wiring lines overlying the interlayer dielectric film and those underlying the interlayer dielectric film.

If scratches are formed in active regions in which gates are to be formed during a planarizing process for planarizing a film formed in shallow trenches for shallow trench isolation, defects are produced in silicon crystals to deteriorate the characteristics of transistors formed in the active regions.

It is a first object of the present invention to provide a planarizing method employing a fixed abrasive tool capable of polishing a surface without forming detrimental scratches. A second object of the present invention is to provide a planarizing method capable of reducing micro scratches or preventing the formation of micro scratches.

A third object of the present invention is to provide a semiconductor device fabricating method capable of producing semiconductor devices at low costs.

A fourth object of the present invention is to provide a semiconductor device fabricating method capable of preventing short circuit between wiring lines.

A fifth object of the present invention is to provide a semiconductor device fabricating method capable of fabricating semiconductor devices provided with highly reliable component elements.

The above objects are attained by using a fixed abrasive tool containing impurities harder than a workpiece in an impurity content of 10 ppm or below. The present invention can more effectively be achieved by using a fixed abrasive tool containing lanthanum (La) in a lanthanum content of 10 ppm or below if the fixed abrasive tool is composed of abrasive grains of cerium dioxide ($CeO_2$). FIG. 4 is a table showing the impurity contents of a conventional abrasive and a purified abrasive. Cerium dioxide produced by purifying natural rocks unavoidably contains hard lanthanum dioxide.

Elimination of lanthanum from cerium dioxide is effective in reducing scratches. Hard impurity content of cerium dioxide abrasive can effectively be reduced by increasing the purity of cerium dioxide and reducing lanthanum content, and margin for forming scratches can be enlarged.

FIG. 5 is a graph showing the scratching characteristics of fixed abrasive tools respectively having different lanthanum contents (1300 ppm and 9 ppm) determined by polishing insulating films. As obvious from FIG. 5, macro scratch forming frequency can be reduced to $\frac{1}{10}$ when the impurity content is reduced. The hardness of each substance can be expressed in Moh's hardness. For example, silicon dioxide ($SiO_2$), cerium dioxide ($CeO_2$), alumina ($Al_2O_3$) and iron oxide ($Fe_2O_3$) are 6.75, 6, 9 and 6.75 in Moh's hardness, respectively.

The objects of the present invention can effectively be achieved by using needle abrasive grains shaped with breadth diameter and length diameter (or rice-shaped abrasive grains). It is known from FIG. 5 that the use of needle abrasive grains is effective in reducing macro scratches. The use of needle abrasive grains having length diameter/breadth diameter rations of 3 or above is particularly effective and is effective in reducing micro scratches. Abrasives having a 10% wt. needle grain content may be used. It is desirable that abrasives have an needle grain content of 50% wt. or above.

The objects of the present invention can be achieved by using a fixed abrasive tool having a mean pore diameter of 0.2 μm or below. A fixed abrasive tool of needle abrasive grains has a low aggregation and has a uniform pore diameter distribution.

Generally, a method of manufacturing fixed abrasive tools comprises the steps of (1) kneading a mixture of abrasive grains and resin grains, (2) forming, (3) heating and compression molding and (4) molding removal. A fixed abrasive tool has pores (pores indicated at 19 in FIG. 1). The porosity of the fixed abrasive tool is adjusted by amount of compression used in the step (3). Usually, the porosity of fixed abrasive tool is about 50%. Porosity is not adjusted when manufacturing a conventional fixed abrasive tool, and the conventional fixed abrasive tool has a mean pore diameter of about 0.3 μm and pore diameters are distributed in a wide range as shown in FIG. 7.

Since needle abrasive grains have a low aggregating property owing to their shape, needle abrasive grains form a fixed abrasive tool having pores of pore diameters distributed in a narrow range and having a mean pore diameter on the order of 0.1 µm. The reduction of the maximum pore diameter to 0.5 µm or below is highly effective in reducing macro scratches and also effective in reducing micro scratches. Although it is desirable that pores of the fixed abrasive tool do not include pores of diameters not smaller than 0.5 µm, there is no practical problem in using the fixed abrasive tool having pores of diameters not smaller than 0.5 µm, provided that the content of such large pores is 10% vol. or below. The pore diameter distribution in the fixed abrasive tool was measured by a mercury porosimeter.

The objects of the present invention can be achieved by using abrasive grains of 1 g/cm$^3$ or below in bulk density. Bulk density is the ratio of the weight of a fixed volume of abrasive grains to the fixed volume. The bulk density decreases as the pores increase. The bulk density is large when the number of pores is small and abrasive grains are packed densely.

The respective bulk densities of polyhedral abrasive grains forming a conventional fixed abrasive tool and needle abrasive grains forming a fixed abrasive tool employed in the present invention are 2 g/cm$^3$ and 0.5 g/cm$^3$. Needle abrasive grains have a small bulk density and hence the porosity of a fixed abrasive tool formed of needle abrasive grains can be adjusted properly in a wide porosity range. It is known that the length diameter-to-breadth diameter ratio of needle abrasive grains is 3 or above. Such shapes of needle abrasive grains makes the bulk density of the needle abrasive grains small.

The object of the present invention can be achieved by using abrasive grains having a maximum grain size of 1 µm or below. Use of abrasive grains having small grain sizes suppresses stress concentration on the surface of a workpiece and hence reduces micro scratches. As obvious from FIG. 6, the number of micro scratches increases substantially in proportion to grain size as shown in FIG. 6.

The finer the abrasive grains, the greater is the effect in reducing micro scratches. However, abrasive grains having a submicron mean grain size aggregate unavoidably and the apparent grain size of the abrasive grains increases. Abrasive grains having a mean grain size not greater than 0.5 µm are practically effective in reducing micro scratches and, if the maximum grain size of the abrasive grains is not greater than 1 µm, the formation of micro scratches can more effectively prevented. Although it is desirable to use abrasive grains not including those of grain sizes not smaller than 1 µm, abrasive grains containing abrasive grains of grain sizes not smaller than 1 µm in a content of 1% wt. or below are practically acceptable.

The grain size distribution can be measured by a grain size distribution measuring apparatus that detects scattered laser light, such as a particle size analyzer commercially available from HORIBA or a particle size analyzer SALD-2000A commercially available from Shimazu Corp. A method of determining grain size distribution measures the sizes of images of abrasive grains on magnified photographs of abrasive grains, which, however, has difficulty in increasing the number of samples and hence is unable to provide accurate data. When measuring grain size distribution, it is important to examine measuring conditions thoroughly, to determine optimum conditions for a method of stirring samples taking into account the aggregating property of the abrasive grains and to confirm the reproducibility by repeating measurement at least three times.

The application of the present invention to processing an insulating film and a metal film reduces macro and micro scratches in the insulating film and the metal film. Thus, the present invention provides a reliable semiconductor IC device fabricating method. The fixed abrasive tool may be of multilayer structure. When the fixed abrasive tool is of multilayer structure, it is necessary that only one of the layers of the fixed abrasive tool to be brought into contact with a workpiece meets the foregoing requirements.

These and other objects and many of the attendant advantages of the invention will be readily appreciated as the same becomes better understood by reference to the following detailed description when considered in connection with the accompanying drawings.

BRIEF DESCRIPTION OF THE DRAWINGS

FIG. 9A is a first sectional view of assistance in explaining an isolation film formed in shallow trenches;

FIG. 9B is a second sectional view of assistance in explaining the isolation film formed in the shallow trenches;

FIG. 10 is a typical plan view of wiring lines of assistance in explaining a short circuit between adjacent wiring lines caused in a Damascene process attributable to a scratch;

DETAILED DESCRIPTION OF THE PREFERRED EMBODIMENTS

First Embodiment

Figure 1:
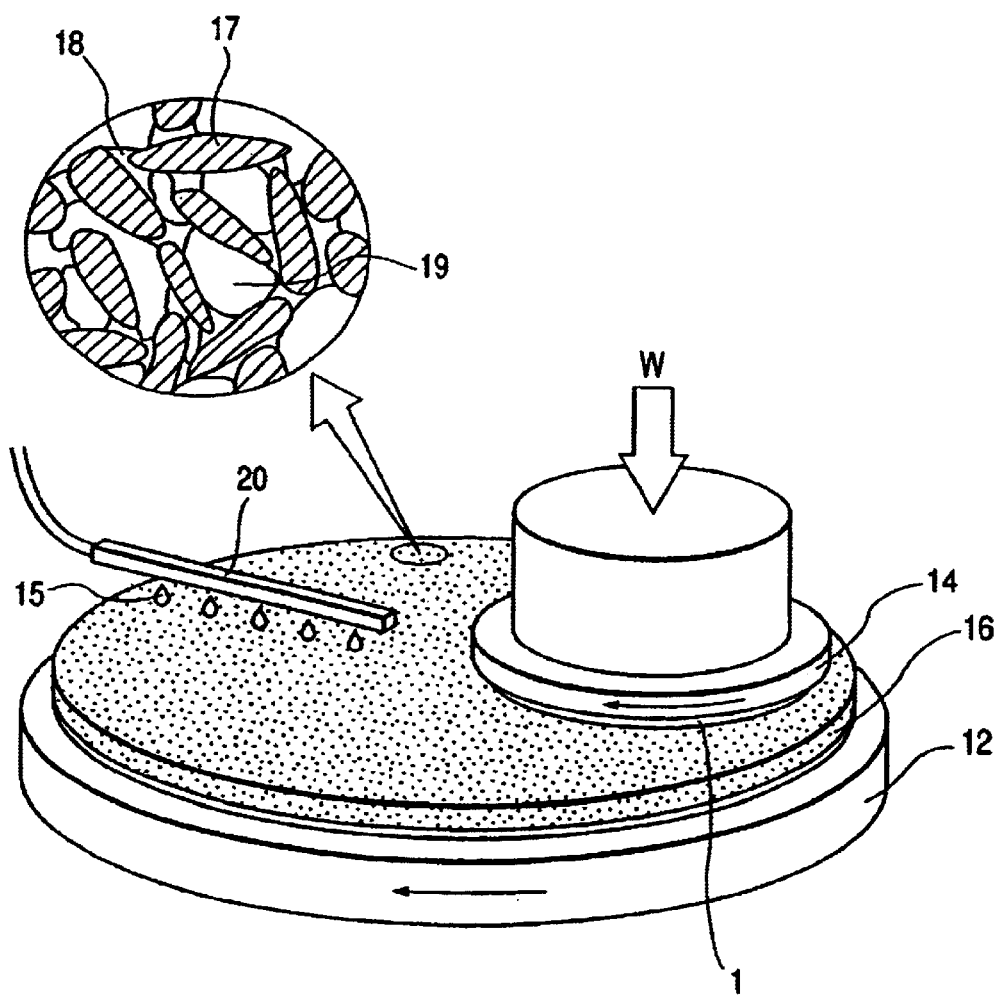
FIG. 1 is a schematic perspective view of a planarizing apparatus relating to the present invention.

Referring to FIG. 1 showing a planarizing apparatus employed in carrying out a semiconductor device fabricating method in a first embodiment according to the present invention, the planarizing apparatus has a polishing platen 12, a fixed abrasive tool 16 attached to the upper surface of the polishing platen 12, a wafer holder 14 for holding a glass or semiconductor wafer 1, and a processing liquid supply unit 20 for supplying a processing liquid during a polishing process. The size of the polishing platen 12 is dependent on that of a wafer to be processed. The diameter of the polishing platen 12 must be twice the diameter of the wafer 1 or greater. When the wafer 1 is an 8 in. diameter wafer, the diameter of the polishing platen 12 is, for example, about 700 mm.

The wafer 1 held by the wafer holder 14 is pressed against the rotating fixed abrasive tool 16. The processing liquid supply unit 20 supplies the processing liquid onto the fixed abrasive tool 16 during a planarizing process 100 to 1000 ml per minute. The processing liquid may be deionized water or a solution of any appropriate one of chemicals. Deionized water is suitable for processing an insulating film. Although an alkaline solution enhances processing rate, waste water must be neutralized before disposal when an alkaline solution is used. Acid solutions, such as a hydrogen peroxide solution and a nitric acid solution, are suitable for processing metal film.

A slurry containing abrasive grains, i.e., a polishing liquid, enhances polishing rate. The processing liquid supply unit 20 must be provided with a component capable of preventing the aggregation of the abrasive grains when the slurry containing abrasive grains is used.

A force (load) W of 200 g/cm$^2$ is applied to the wafer holder 14 to press the wafer 1 held by the wafer holder 14 against the fixed abrasive tool 16. The force W may be in the range of 200 to 500 g/cm$^2$. Removal rate, i.e., amount of film removed per unit time, varies substantially in proportion to the force W. A maximum value of the force W is dependent on the strength of the apparatus including the fixed abrasive tool 16.

The wafer holder 14 and the polishing platen 12 are rotated in the same direction. It is desirable that the wafer holder 14 and the polishing platen 12 are rotated substantially at the same rotating speed to polish the wafer 1 uniformly. The respective rotating speeds of the wafer holder 14 and the polishing platen 12 are in the range of 20 to 100 rpm. In this planarizing apparatus, the rotating speeds are 30 rpm. The higher the rotating speed, the greater is the removal rate. However, a layer of the processing liquid is formed between the wafer 1 and the fixed abrasive tool 16 when the rotating speeds are increased beyond a certain level, and the removal rate reaches a maximum and stops increasing or starts decreasing due to by a hydroplaning effect when the rotating speeds increases beyond a certain level.

The fixed abrasive tool 16 will be described. The fixed abrasive tool 16 which is brought into direct contact with the wafer 1 is formed by bonding together minute cerium dioxide abrasive grains by a resin. When viewed microscopically as shown in a circle in FIG. 1, the fixed abrasive tool 16 has pores 19. When the fixed abrasive tool 16 is used for polishing a metal film, it is preferable to use grains of alumina ($Al_2O_3$), silicon carbide (SiC) or titania ($TiO_2$). The resin for bonding together the abrasive grains may be a phenol resin, polyvinyl alcohol, a silicone resin or a polyester resin.

The cerium dioxide abrasive grains have a mean grain size of 0.5 $\mu$m or below and a maximum grain size of 1 $\mu$m or below. The use of the cerium dioxide abrasive grains of such grain size reduces micro scratches greatly. Although it is desirable to use abrasive grains not including those of grain sizes not smaller than 1 $\mu$m, abrasive grains containing abrasive grains of grain sizes not smaller than 1 $\mu$m in a content of 1% wt. or below are practically acceptable. The formation of macro scratches can be prevented by using cerium dioxide of 99.9% or above in purity, and containing a lanthanum (La) as an impurity in a content of 10 ppm or below.

Needle abrasive grains of shapes expressed by breadth diameter and length diameter, i.e., shapes resembling grains of rice, are not aggregative, and a fixed abrasive tool having a uniform pore diameter distribution can be formed by using needle abrasive grains. When a fixed abrasive tool formed of abrasive grains containing 50% wt. or above needle abrasive grains having length diameter/breadth diameter ratios of 3 or above was used for polishing, both macro and micro scratches were reduced. When the mean pore diameter is 0.2 $\mu$m or below, the number of scratches can be reduced to a practically acceptable level. The limitation of the maximum pore diameter to 0.5 $\mu$m or below is effective in reducing macro scratches.

Second Embodiment

A semiconductor device fabricating method in a second embodiment according to the present invention will be described as applied to processing a tetraethylorthosilicate (p-TEOS) film formed on a silicon wafer by using a plasma. A planarizing apparatus similar to that employed in carrying out the first embodiment is used.

The p-TEOS film ($SiO_2$ film) is deposited on a flat surface of a wafer not provided with any pattern thereon. Deionized water is used as a processing liquid. The surface of a fixed abrasive tool 16 is dressed with a dresser, not shown, before starting a processing operation to expose abrasive grains that contribute to planarization on the surface of the fixed abrasive tool 16. The thus dressed fixed abrasive tool 16 is able to polish the surface of the film uniformly and to maintain removal rate on a desired level. Dressing the fixed abrasive tool 16 so that the working surface thereof is smooth and flat is effective in suppressing the formation of scratches.

More concretely, a cup-shaped dresser having diamond grains deposited by electrodeposition is mounted on a spindle. The spindle is rotated at a high rotating speed and the dresser is moved along the surface of the fixed abrasive tool 16 while the absolute height of the dresser is controlled so that only a surface layer of about 1 $\mu$m in thickness of the fixed abrasive tool 16 is removed.

After the fixed abrasive tool 16 has thus been dressed, a wafer 1 provided with a 500 nm thick p-TEOS film deposited thereon is chucked on a wafer holder 14, and then the wafer 1 is pressed against the fixed abrasive tool 16 for processing. Deionized water is used as a processing liquid, the wafer holder 14 and the fixed abrasive tool 16 are rotated at 30 rpm, and the wafer 1 is pressed against the fixed abrasive tool 16 by a force of 200 g/cm². During the processing operation, the surface of the fixed abrasive tool 16 is scrubbed with a brush provided with nylon bristles to free abrasive grains from the fixed abrasive tool 16. Removal rate increases as free abrasive grains increases.

Figure 12:
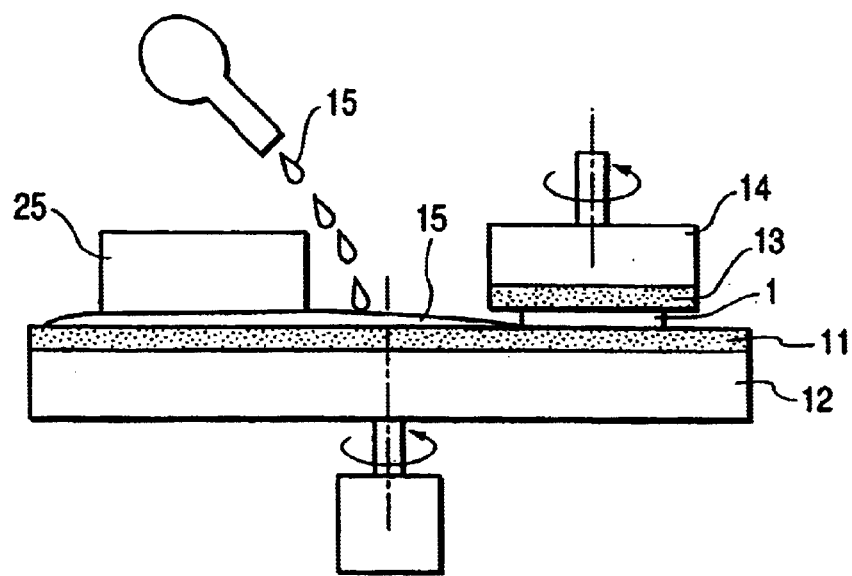
FIG. 12 is a planarizing apparatus provided with an ultrasonic vibrator.

The fixed abrasive tool 16 may be vibrated by an ultrasonic vibrator 25 as shown in FIG. 12 to increase removal rate instead of scrubbing the fixed abrasive tool 16 with the brush. The ultrasonic vibrator generates vibrations in the range of 20 to 50 kHz and has an output power of 100 W. The distance between the surface of the fixed abrasive tool 16 and the ultrasonic vibrator 25 is selectively determined so that free abrasive grains are produced most efficiently, and the position of the ultrasonic vibrator 25 is fixed relative to the fixed abrasive tool 16. The ultrasonic vibrator does not have parts subject to abrasion while the brush is abraded, and does not produce impurities.

Figure 5:
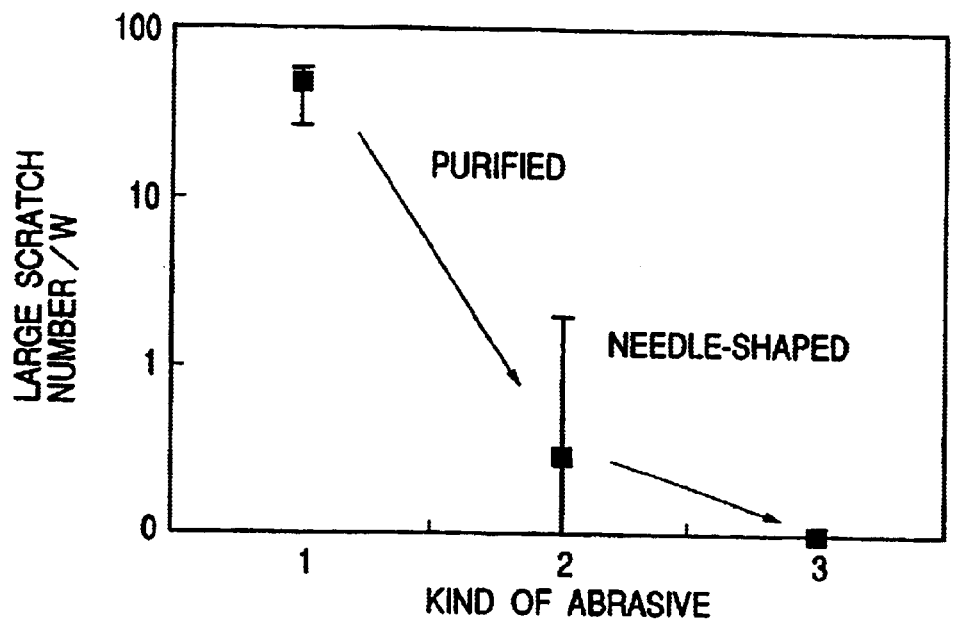
FIG. 5 is a graph showing the results of evaluation of macro scratches formed in a surface.
Figure 6:
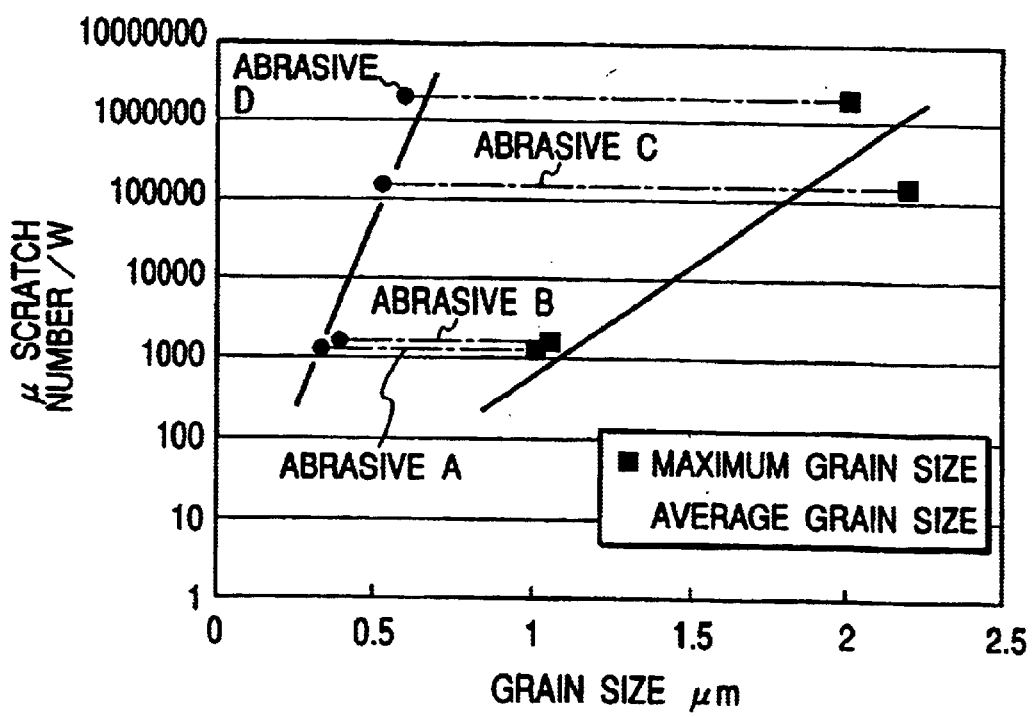
FIG. 6 is a graph showing the results of evaluation of macro scratches formed in a surface.
Figure 7:
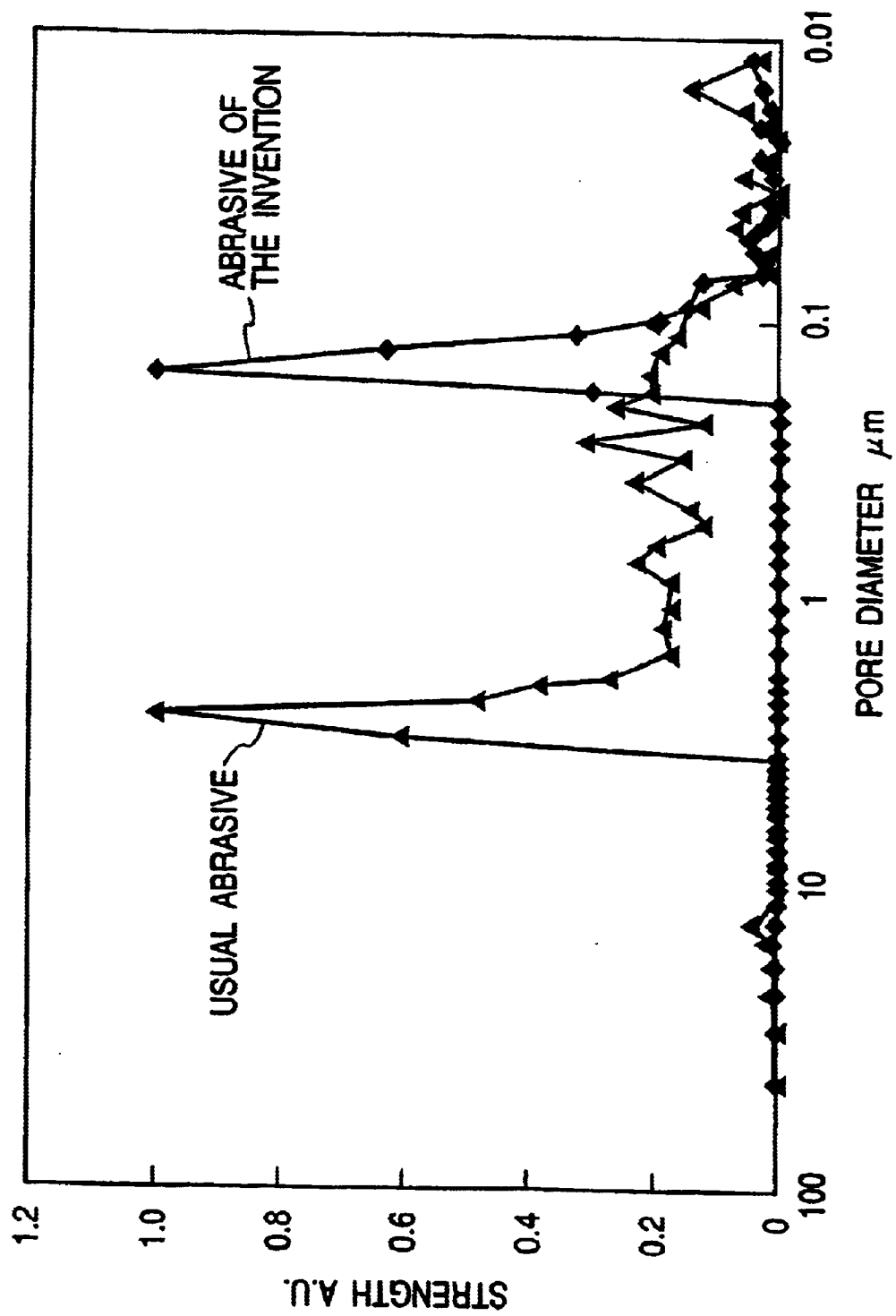
FIG. 7 is a graph showing pore diameter distributions in a conventional fixed abrasive tool and a fixed abrasive tool in accordance with the present invention.
Figure 8:
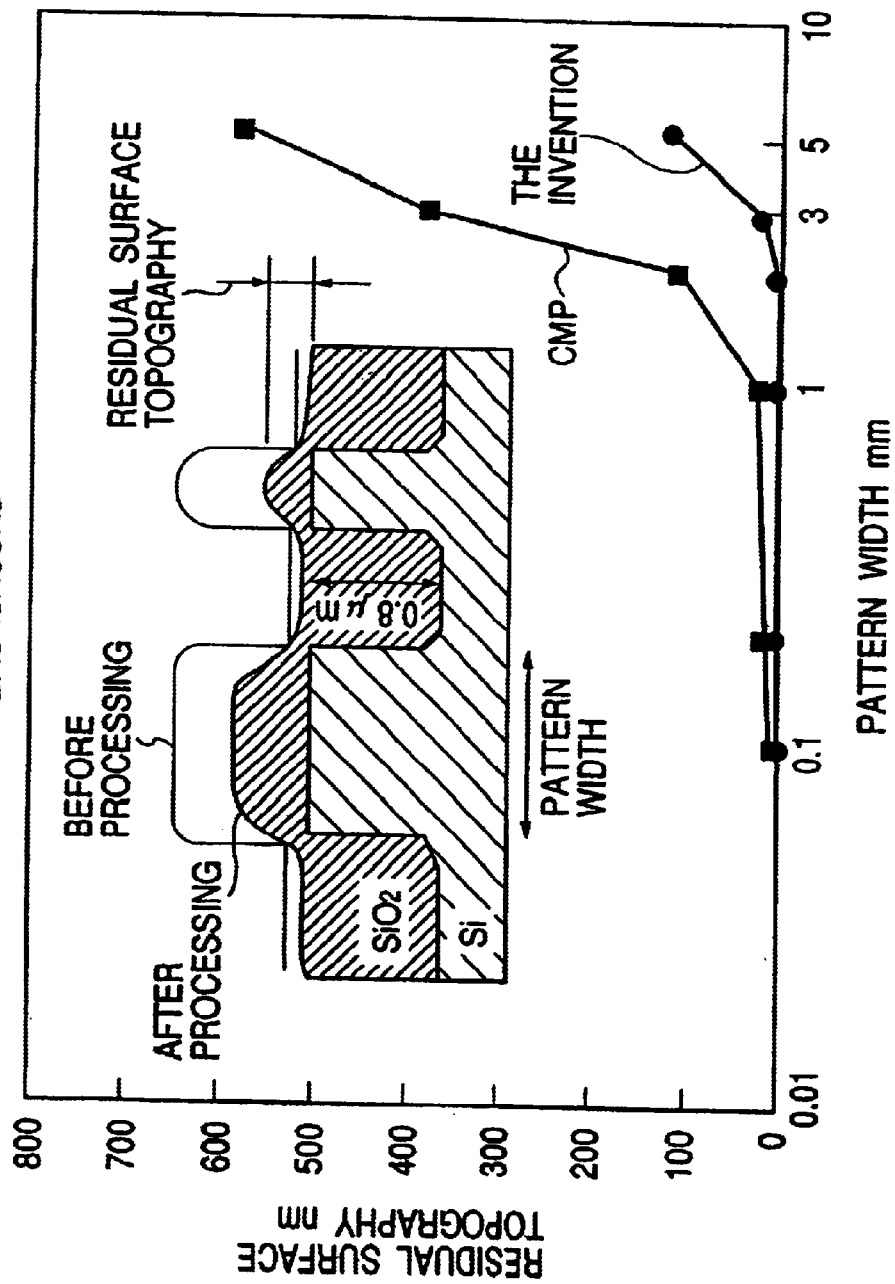
FIG. 8 is a graph showing the results of evaluation of planarization.

After the processing operation has been completed, the wafer 1 is removed from the wafer holder 14, cleaned and dried. FIGS. 5 and 6 show the results of the processing operation for the planarization of the wafer 1. As obvious from FIGS. 5 and 6, the planarizing process in accordance with the present invention is effective in reducing scratches and the wafer 1 can be planarized in a satisfactory quality. The planarizing performance of the fixed abrasive tool 16 is satisfactory. The planarizing process is applicable for the same effect to planarizing an organic SOG film. The thickness distribution in the film thus processed can be evaluated from the optical multiple reflection interference characteristics of the film.

Third Embodiment

Figure 2A:
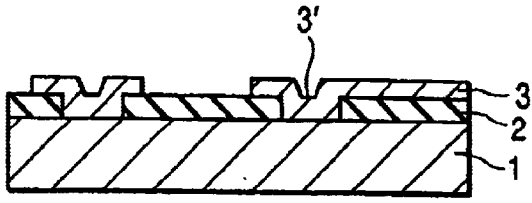
FIG. 2A is a first sectional view of an essential part of a semiconductor wafer in explaining a surface planarizing process.
Figure 2B:
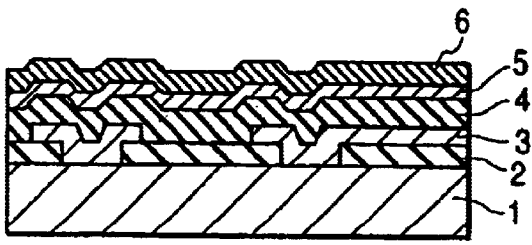
FIG. 2B is a second sectional view of an essential part of the semiconductor wafer in explaining the surface planarizing process.
Figure 2C:
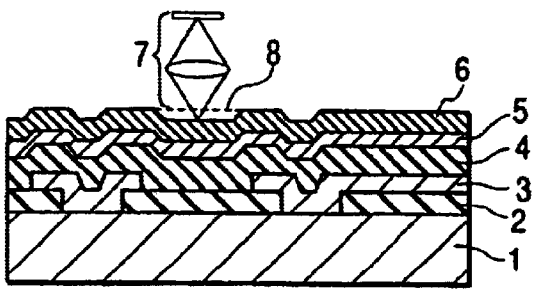
FIG. 2C is a third sectional view of an essential part of the semiconductor wafer in explaining the surface planarizing process.
Figure 2D:
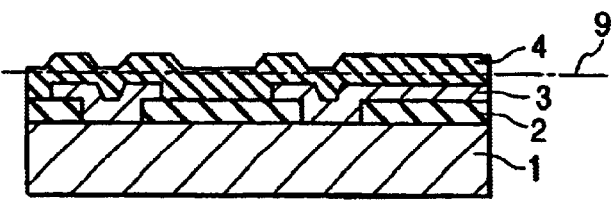
FIG. 2D is a fourth sectional view of an essential part of the semiconductor wafer in explaining the surface planarizing process.
Figure 2E:
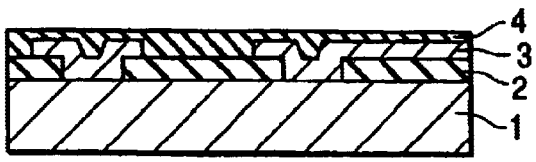
FIG. 2E is a fifth sectional view of an essential part of the semiconductor wafer in explaining the surface planarizing process.
Figure 2F:
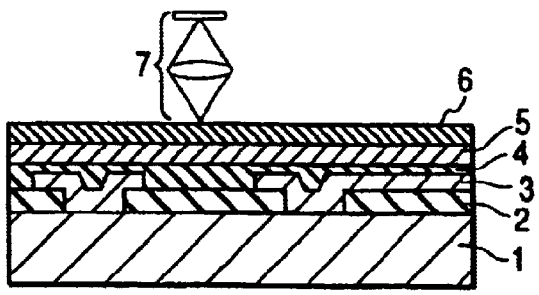
FIG. 2F is a sixth sectional view of an essential part of the semiconductor wafer in explaining the surface planarizing process.
Figures 3, 4:
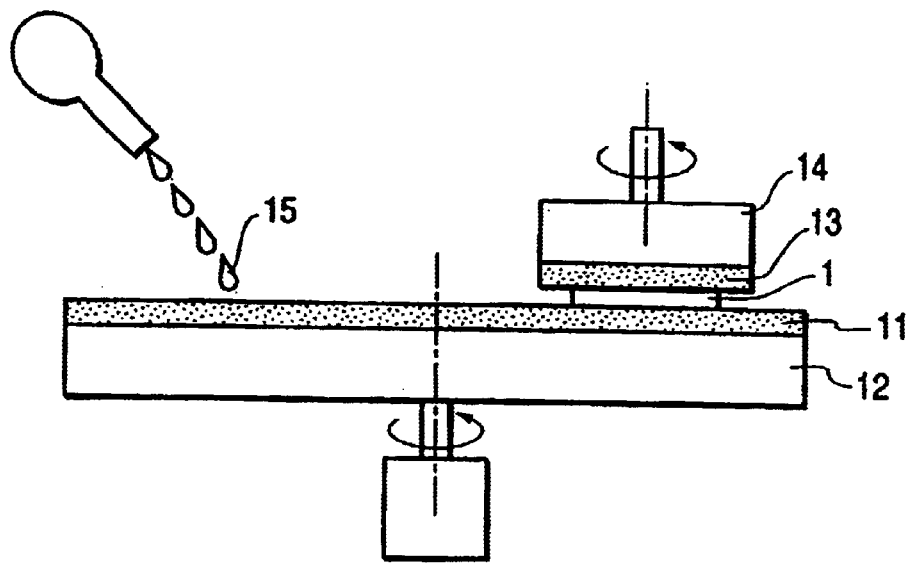
FIG. 3 is a side view of a chemical mechanical polishing apparatus.
FIG. 4 is a table showing results of analysis of impurities contained in fixed abrasive tools.

A semiconductor device fabricating method in a third embodiment according to the present invention will be described as applied to a p-TEOS film formed on a surface of a semiconductor wafer 1 provided with a pattern thereon. As shown in FIG. 2A, the semiconductor wafer 1 is provided with a interconnection layer 3 of 500 nm in thickness. A 700 nm thick p-TEOS film is deposited on the wafer 1 as shown in FIG. 2D. A surface layer of about 600 nm in thickness of the p-TEOS film is removed by polishing by a planarizing apparatus similar to that employed in carrying out the semiconductor device fabricating method in the second embodiment. A p-TEOS film was polished by the semiconductor device fabricating method. significant scratches were not formed in the surface of the p-TEOS film. The p-TEOS film was planarized satisfactorily and wiring lines of a second interconnection layer formed on the planarized p-TEOS were not short-circuited at all.

A CMP method polishes the bottom surfaces of recessed parts of a film. Therefore, the film must be formed in a thickness of about 1000 nm to planarize the same by polishing. The planarizing process in accordance with the present invention using the fixed abrasive tool does not polish the bottom surfaces of recessed parts of a film, and hence the film may be formed in a thickness as small as 700 nm. Consequently, processing time is reduced and throughput is improved. Planarizing experiments proved that the planarizing process is effective in planarizing a silicon dioxide film formed by a CVD (chemical vapor deposition) method.

Fourth Embodiment

The present invention is effectively applicable also to processing polysilicon films and metal films, such as aluminum films, copper films and tungsten films. A semiconductor device fabricating method in a fourth embodiment according to the present invention will be described as applied to processing a copper film.

FIGS. 11A to 11E are sectional views of an essential part of a semiconductor wafer in different stages of a Damascene process for forming wiring lines.

Figure 11:
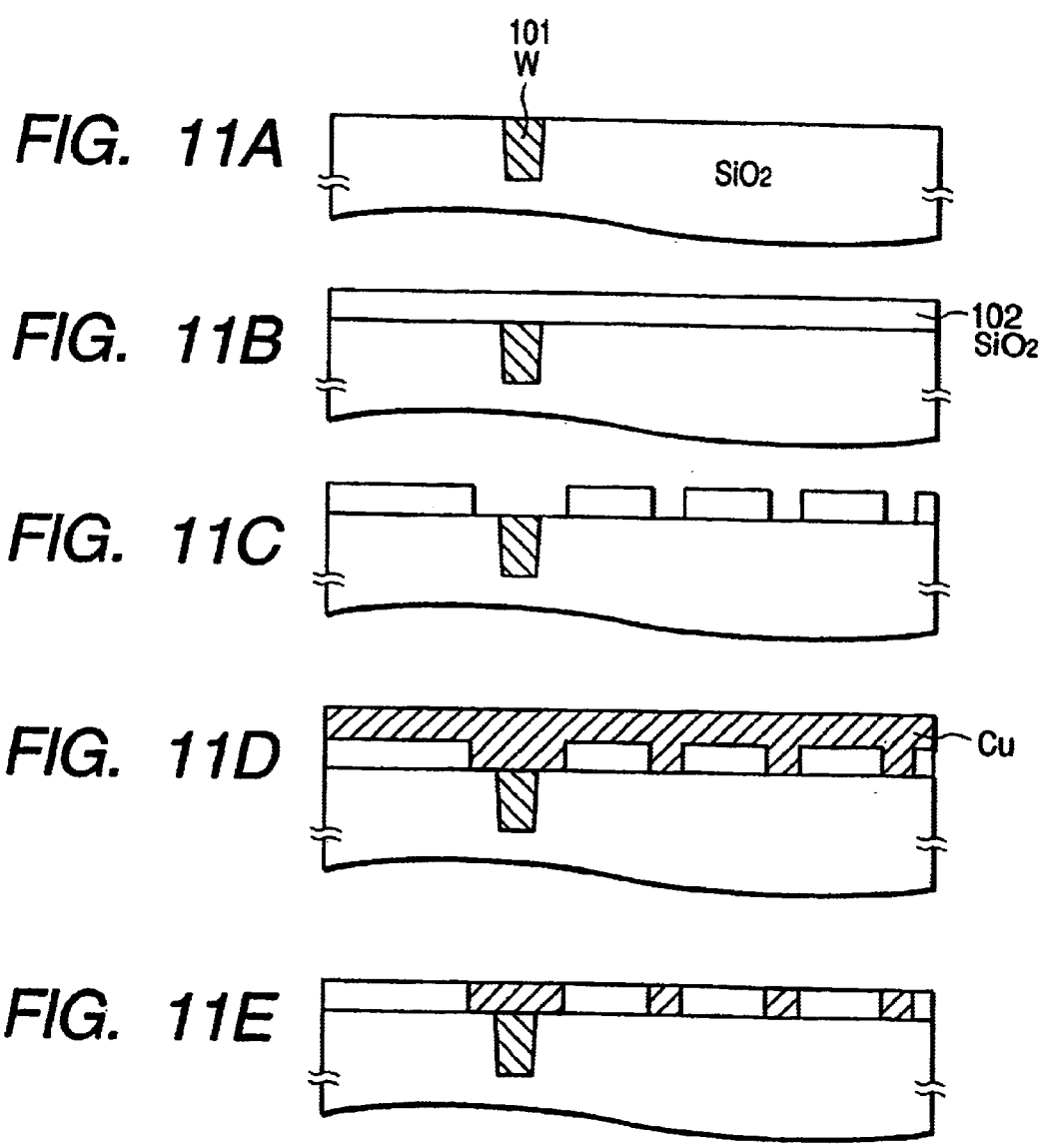
FIG. 11A is a first sectional view of assistance in explaining a Damascene process.
FIG. 11B is a second sectional view of assistance in explaining the Damascene process.
FIG. 11C is a third sectional view of assistance in explaining the Damascene process.
FIG. 11D is a fourth sectional view of assistance in explaining the Damascene process.
FIG. 11E is a fifth sectional view of assistance in explaining the Damascene process.

Plugs 101 of tungsten (W) are formed in contact holes reaching a lower layer, not shown, as shown in FIG. 11A. The plugs 101 may be formed by a process employing the fixed abrasive tool in accordance with the present invention. A 0.9 μm thick silicon dioxide film 102 is formed as shown in FIG. 11B. The surface of the silicon dioxide film 102 is planarized by a planarizing process using the fixed abrasive tool containing cerium dioxide abrasive grains and employed in the first embodiment, and the silicon dioxide film is patterned to form grooves in regions of the silicon dioxide film corresponding to wiring lines of a interconnection layer as shown in FIG. 11C. A 50 nm thick titanium nitride (TiN) film as a barrier metal layer, and a 50 nm thick copper film as a seed layer are formed by sputtering as shown in FIG. 11D. And then the surface of the copper film is planarized by a planarizing process in accordance with the present invention as shown in FIG. 11E.

Figure 13:
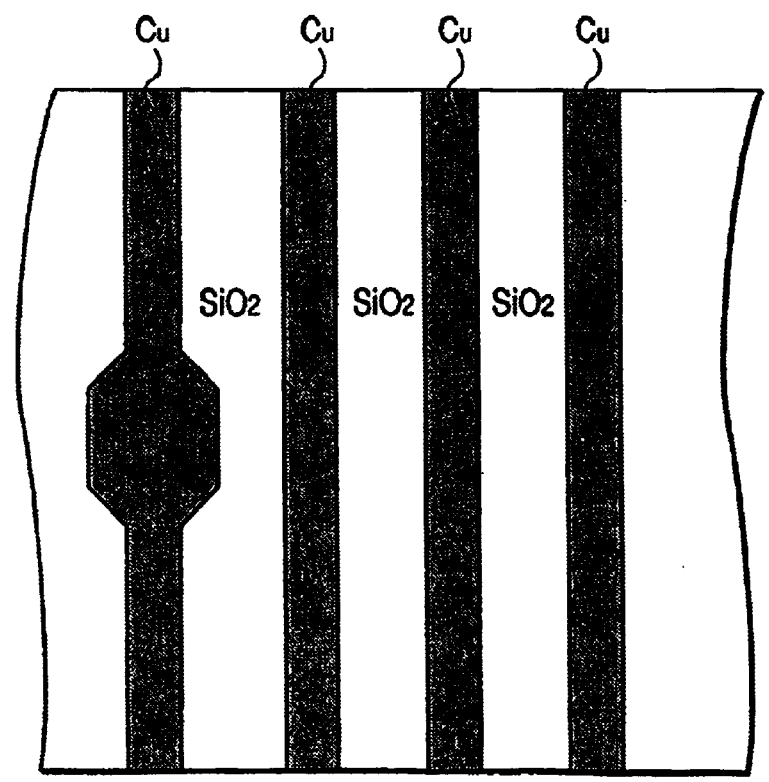
FIG. 13 is a typical plan view of a interconnection layer formed by the Damascene process.

FIG. 13 shows the surface of the wafer finished by planarizing the copper film by a planarizing process using a fixed abrasive tool containing alumina grains and acid hydrogen peroxide solution as a processing liquid. Experiments proved that the semiconductor device fabricating method is able to fabricate highly reliable semiconductor devices having neither short circuits between wiring the lines of a interconnection layer as shown in FIG. 10 nor short circuits between wiring lines of different interconnection layers. Grains of titania, ceria, silica or manganese dioxide may be used instead of alumina grains. Deionized water may be used as a processing liquid. Although removal rate decreases, waste water disposal is simplified when deionized water is used as a processing liquid.

Fifth Embodiment

A semiconductor device fabricating method in a fifth embodiment according to the present invention will be described as applied to forming isolation regions of a semiconductor device with reference to FIGS. 9A and 9B.

FIGS. 9A and 9B are sectional views of an essential part of a semiconductor wafer of assistance in explaining a process for forming a STI (shallow trench isolation) layer. A shallow trench isolation layer forming step is executed at an early stage of a semiconductor device fabricating process. As shown in FIG. 9A, shallow trenches 22 are formed in the surface of a silicon wafer 1, and a silicon nitride film 21 is formed on the surfaces of lands, i.e., surfaces forming active fields. Transistors are formed on the lands by later steps. The lands and the shallow trenches 22 are covered with an oxide film 4. Projections are formed in regions of the surface of the oxide film 4 corresponding to the lands, and recesses are formed in regions of the same corresponding to the shallow trenches 22. The surface of the oxide film 4 having a three-dimensional shape is planarized as shown in FIG. 9B by a STI layer planarizing process.

The STI layer planarizing process is carried out by a planarizing apparatus similar to that employed in the first embodiment provided with a fixed abrasive tool. The silicon wafer 1 provided with the silicon nitride film 21, the shallow trenches 22 and the oxide film 4 as shown in FIG. 9A is fixedly held on a wafer holder 14. The working surface of a fixed abrasive tool 16 containing cerium dioxide grains is dressed.

The silicon wafer 1 is pressed against the working surface of the fixed abrasive tool 16, the silicon wafer 1 and the fixed abrasive tool 16 are rotated, and the working surface of the fixed abrasive tool 16 is scrubbed with a brush to polish the surface of the silicon wafer 1. The surface of the silicon wafer 1 is thus polished for a polishing time in the range of 1 to 2 min. An optimum polishing time is determined through the experimental polishing of dummy wafers. Then, the wafer 1 is cleaned and dried to complete the planarizing process.

The planarized surfaces of wafers finished by experimental planarizing process in accordance with the present invention were examined. No macro scratches was formed in the surface of the silicon nitride film 21 and the introduction of defects in the crystals of the wafers could be prevented. Transistors formed on those wafers had small junction leakage currents and had satisfactory characteristics. Dishing, i.e., formation of hollows in regions of the surface of the oxide film 4 corresponding to the underlying trenches 22, and formation of burrs in edges did not occur and the oxide film 4 was planarized satisfactorily. The experimental results proved that the planarizing process is applicable to a semiconductor device fabricating method.

Both global planarization and substantial macro scratch elimination can be achieved also by using a hard pad having a hardness of 1000 kg/cm$^2$ or above and an abrasive slurry containing an abrasive having an impurity content of 10 ppm or below. Micro scratches can be reduced by using an abrasive slurry containing needle abrasive grains.

The planarizing process in accordance with the present invention is capable of achieving high planarization which cannot be achieved by the conventional CMP process, and of planarizing the surface of a film in a planar surface not having scratches without using any abrasive slurry.

The semiconductor device fabricating method employing the planarizing method in accordance with the present invention is capable of fabricating a reliable semiconductor device producing only a small junction leakage current, and free from short circuits between the component wiring lines.

It is further understood by those skilled in the art that the foregoing description is a preferred embodiment of the disclosed device and that various changes and modifications may be made in the invention without departing from the spirit and the scope thereof.

What is claimed is:

1. A planarizing apparatus which planarizes a surface of a wafer by pressing the wafer against a fixed abrasive tool containing abrasive grains and rotating the wafer and the fixed abrasive tool relative to each other,
   wherein the abrasive grains contained in the fixed abrasive tool have a purity of 99.9% or above, and the fixed abrasive tool has a lanthanum content of 10 ppm or below, and
   wherein the abrasive grains have length diameter and breadth diameter, and the abrasive grains include those having length diameter/breadth diameter ratios of three or above.

2. The planarizing apparatus according to claim 1, wherein the abrasive grains have a bulk density of 1 g/cm$^3$ or below.

3. The planarizing apparatus according to claim 2, wherein the fixed abrasive tool has pores a mean pore diameter of which is 0.2 $\mu$m or below.

4. The planarizing apparatus according to claim 3, wherein at least 50% by weight of the abrasive grains have length diameter/breadth diameter ratios of three or more.

5. The planarizing apparatus according to claim 3, wherein the abrasive grains are cerium dioxide grains.

6. The planarizing apparatus according to claim 3, wherein the abrasive grains have a mean grain size of 0.5 $\mu$m or below and a maximum grain size of 1 $\mu$m or below.

7. The planarizing apparatus according to claim 3, wherein the fixed abrasive tool has pores a maximum pore diameter of which is 0.5 $\mu$m.

8. The planarizing apparatus according to claim 1, wherein at least 50% by weight of the abrasive grains have length diameter/breadth diameter ratios of three or more.

9. A planarizing apparatus for planarizing a surface of a wafer, comprising:
   a wafer holder;
   a fixed abrasive tool containing abrasive grains; and
   structure which forces the surface of the wafer held by said wafer holder to be pressed against the fixed abrasive tool and which rotates the wafer and the fixed abrasive tool relative to each other,
   wherein the abrasive grains contained in the fixed abrasive tool have a purity of 99.9% or above, and the fixed abrasive tool has a lanthanum content of 10 ppm or below, and
   wherein the abrasive grains have length diameter and breadth diameter, and the abrasive grains include those having length diameter/breadth diameter ratios of three or above.

10. The planarizing apparatus according to claim 9, wherein the abrasive grains have a bulk density of 1 g/cm$^3$ or below.

11. The planarizing apparatus according to claim 10, wherein the fixed abrasive tool has pores a mean pore diameter of which is 0.2 $\mu$m or below.

12. The planarizing apparatus according to claim 11, wherein at least 50% by weight of the abrasive grains have length diameter/breadth diameter ratios of three or more.

13. The planarizing apparatus according to claim 11, wherein the abrasive grains are cerium dioxide grains.

14. The planarizing apparatus according to claim 11, wherein the abrasive grains have a mean grain size of 0.5 $\mu$m or below and a maximum grain size of 1 $\mu$m or below.

15. The planarizing apparatus according to claim 11, wherein the fixed abrasive tool has pores a maximum pore diameter of which is 0.5 $\mu$m.

16. The planarizing apparatus according to claim 9, wherein at least 50% by weight of the abrasive grains have length diameter/breadth diameter ratios of three or more.

* * * * *